US010393842B1

(12) United States Patent
Cheng et al.

(10) Patent No.: US 10,393,842 B1
(45) Date of Patent: Aug. 27, 2019

(54) HIGHLY-SCALABLE IMAGE RECONSTRUCTION USING DEEP CONVOLUTIONAL NEURAL NETWORKS WITH BANDPASS FILTERING

(71) Applicant: The Board of Trustees of the Leland Stanford Junior University, Palo Alto, CA (US)

(72) Inventors: Joseph Y. Cheng, Los Altos, CA (US); Shreyas S. Vasanawala, Stanford, CA (US); John M. Pauly, Stanford, CA (US)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 54 days.

(21) Appl. No.: 15/900,330

(22) Filed: Feb. 20, 2018

(51) Int. Cl.
*G01R 33/56* (2006.01)
*G01R 33/48* (2006.01)
(Continued)

(52) U.S. Cl.
CPC ..... *G01R 33/5608* (2013.01); *G01R 33/4824* (2013.01); *G01R 33/5611* (2013.01);
(Continued)

(58) Field of Classification Search
CPC ............ G01R 33/5608; G01R 33/5611; G01R 33/56509; G01R 33/4824; G01R 33/56545; G06T 2207/10088
See application file for complete search history.

(56) References Cited

U.S. PATENT DOCUMENTS 6,841,998 B1 1/2005 Griswold
8,379,951 B2 2/2013 Lustig
(Continued)

OTHER PUBLICATIONS

Chen Qin et al. "Convolutional Recurrent Neural Networks for Dynamic MR Image Reconstruction," Jan. 26, 2018, accessed from https://arxiv.org/pdf/1712.01751.pdf.
(Continued)

*Primary Examiner* — G. M. A Hyder
(74) *Attorney, Agent, or Firm* — Lumen Patent Firm

(57) ABSTRACT

A method for magnetic resonance imaging (MRI) scans a field of view and acquires sub-sampled multi-channel k-space data U. An imaging model A is estimated. Sub-sampled multi-channel k-space data U is divided into sub-sampled k-space patches, each of which is processed using a deep convolutional neural network (ConvNet) to produce corresponding fully-sampled k-space patches, which are assembled to form fully-sampled k-space data V, which is transformed to image space using the imaging model adjoint $A_{adj}$ to produce an image domain MRI image. The processing of each k-space patch $u_i$ preferably includes applying the k-space patch $u_i$ as input to the ConvNet to infer an image space bandpass-filtered image $y_i$, where the ConvNet comprises repeated de-noising blocks and data-consistency blocks; and estimating the fully-sampled k-space patch $v_i$ from the image space bandpass-filtered image $y_i$ using the imaging model A and a mask matrix.

8 Claims, 5 Drawing Sheets

(51) Int. Cl.
*G01R 33/565* (2006.01)
*G01R 33/561* (2006.01)

(52) U.S. Cl.
CPC . *G01R 33/56509* (2013.01); *G01R 33/56545* (2013.01); *G06T 2207/10088* (2013.01)

(56) References Cited

U.S. PATENT DOCUMENTS

| | | | | |
|---|---|---|---|---|
| 8,855,431 | B2 | 10/2014 | Donoho | |
| 9,588,207 | B2 | 3/2017 | Weller | |
| 2016/0162782 | A1 * | 6/2016 | Park | G06N 3/0454 706/17 |
| 2016/0195597 | A1 | 7/2016 | Huang | |
| 2017/0046616 | A1 * | 2/2017 | Socher | G06F 17/50 |
| 2018/0061058 | A1 * | 3/2018 | Xu | G06K 9/6269 |
| 2018/0144214 | A1 * | 5/2018 | Hsieh | G06K 9/6265 |
| 2018/0144466 | A1 * | 5/2018 | Hsieh | G06F 19/00 |
| 2018/0286037 | A1 * | 10/2018 | Zaharchuk | G06T 7/0012 |

OTHER PUBLICATIONS

Lee et al., "Deep artifact learning for compressed sensing and parallel MRI Dongwook," Mar. 3, 2017, accessed from https://arxiv.org/pdf/1703.01120.pdf.

Jo Schlemper et al., "Deep Cascade of Convolutional Neural Networks for MR Image Reconstruction," Mar. 1, 2017, accessed from https://arxiv.org/pdf/1703.00555.pdf.

Shanshan Wang et al., "Accelerating Magnetic Resonance Imaging Via Deep Learning," Biomedical Imaging (ISBI), 2016 IEEE 13th International Symposium on, Apr. 13-16, 2016. Accessed from https://par.nsf.gov/servlets/purl/10018752.

Michael T. McCann et al., "Review of Convolutional Neural Networks for Inverse Problems in Imaging," Oct. 11, 2017, accessed from https://arxiv.org/pdf/1710.04011.pdf.

Yan Yang et al., "Deep ADMM-Net for Compressive Sensing MRI," 30th Conference on Neural Information Processing Systems (NIPS 2016), Barcelona, Spain. Accessed from http://papers.nips.cc/paper/6406-deep-admm-net-for-compressive-sensing-mri.pdf.

* cited by examiner

FIG. 5

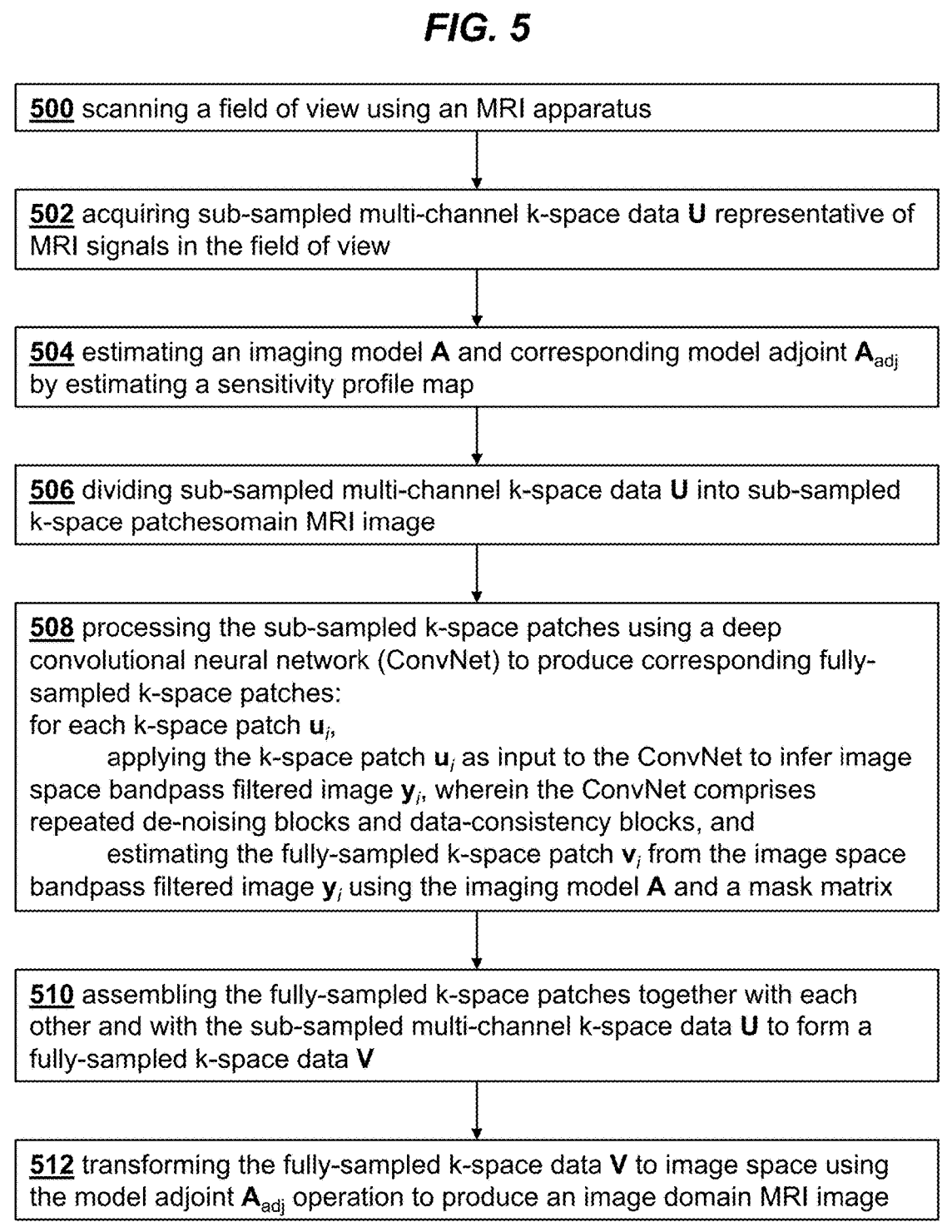

500 scanning a field of view using an MRI apparatus

↓

502 acquiring sub-sampled multi-channel k-space data U representative of MRI signals in the field of view

↓

504 estimating an imaging model A and corresponding model adjoint $\mathbf{A}_{adj}$ by estimating a sensitivity profile map

↓

506 dividing sub-sampled multi-channel k-space data U into sub-sampled k-space patchesomain MRI image

↓

508 processing the sub-sampled k-space patches using a deep convolutional neural network (ConvNet) to produce corresponding fully-sampled k-space patches:
for each k-space patch $\mathbf{u}_i$,
applying the k-space patch $\mathbf{u}_i$ as input to the ConvNet to infer image space bandpass filtered image $\mathbf{y}_i$, wherein the ConvNet comprises repeated de-noising blocks and data-consistency blocks, and
estimating the fully-sampled k-space patch $\mathbf{v}_i$ from the image space bandpass filtered image $\mathbf{y}_i$ using the imaging model A and a mask matrix

↓

510 assembling the fully-sampled k-space patches together with each other and with the sub-sampled multi-channel k-space data U to form a fully-sampled k-space data V

↓

512 transforming the fully-sampled k-space data V to image space using the model adjoint $\mathbf{A}_{adj}$ operation to produce an image domain MRI image

HIGHLY-SCALABLE IMAGE RECONSTRUCTION USING DEEP CONVOLUTIONAL NEURAL NETWORKS WITH BANDPASS FILTERING

STATEMENT REGARDING FEDERALLY SPONSORED RESEARCH OR DEVELOPMENT

This invention was made with Government support under contracts R01 EB019241 and R01-EB009690 awarded by the National Institutes of Health. The Government has certain rights in the invention.

FIELD OF THE INVENTION

The present invention relates generally to techniques for magnetic resonance imaging. More specifically, it relates to improved methods for magnetic resonance image reconstruction and artifact reduction.

BACKGROUND OF THE INVENTION

The ability to reconstruct magnetic resonance (MR) images from vastly undersampled acquisitions has significant clinical value. It allows the duration of the MR scan to be reduced and enables the visualization of rapid hemodynamics.

Using advanced image reconstruction algorithms, images can be reconstructed with negligible loss in image quality despite high undersampling factors (R>6). To achieve this performance, algorithms exploit the data acquisition model with the localized sensitivity profiles of high-density receiver coil arrays for parallel imaging. Additionally, image sparsity can be exploited to constrain the reconstruction problem for compressed sensing. With the use of nonlinear sparsity priors, these types of reconstruction problems are solved using an iterative algorithm. These traditional iterative algorithms, however, have considerable computational complexity for undersampled data.

To improve the image reconstruction in terms of speed and robustness, deep convolutional neural networks (ConvNets) have been proposed. There are various challenges in applying ConvNets to MRI reconstruction, however.

ConvNets are conventionally trained and applied in the image domain. With the fundamental elements of the network as simple convolutions, convolutional neural networks are simple to train and fast to apply. In contrast, MRI data acquisition differs from conventional imaging applications because the data acquisition is performed in the frequency domain, or k-space domain. Consequently, many of the known techniques for image processing with ConvNets do not directly translate to MRI image reconstruction.

Existing ConvNets do not explicitly enforce that the reconstruction solution will not deviate from the measured data. Without a data consistency step, the ConvNets may "hallucinate" new structures in the image or remove existing ones, leading to erroneous diagnosis.

On the other hand, if an attempt is made to use a data consistency step, the training and application can not be image-patch based, because if only small image patches are used, known information in the measurement domain (k-space domain) is lost. As a result, the ConvNets must be applied and trained on fixed image sizes and resolutions. Thus, to train a ConvNet to accurately reconstruct a high-resolution MR image, the specific ConvNet must be trained on MR images with equivalent or higher spatial resolutions.

This limitation increases the memory footprint of the ConvNet and decreases the speed of training and inference.

In addition, existing ConvNet techniques are not easily extendable to high-dimensional MR images and multi-dimensional MR images, because the training and inference of the ConvNet can never be fully parallelized: specific steps within the ConvNet (such as transforming from k-space domain to image domain) requires the gathering of all data before proceeding to the next step of the network.

BRIEF SUMMARY OF THE INVENTION

In contrast to prior techniques, which divide imaging data into image-domain patches for training and inference, the present invention divides the imaging data into frequency-domain patches. At the same time, the techniques of the present invention leverage the use of the imaging model to ensure that the reconstructed images do not deviate from the undersampled measurement data. The invention also can naturally account for images with differing resolutions and sizes by reconstructing different frequency bands independently. The technique is able to train and apply a model for images of varying resolutions which increases the flexibility of the network and minimize the need to re-train the network for each specific case.

The techniques of the present invention train and apply ConvNets on patches of k-space domain data. In other words, a bandpass filter is used to select and isolate the reconstruction to small localized patches in the k-space domain. With contiguous patches of k-space, the ability to exploit the data acquisition model is maintained which enables a ConvNet architecture to enforce consistency with the measured data. Also, by selecting small patches of k-space domain, the input data sizes into the ConvNets are reduced which decreases the memory footprint and increases the computational speed. This smaller memory requirement enables the processing of extremely large datasets in terms of size of each dimension and/or the number of dimensions. Thus, the possible resolutions are not limited by the computation hardware or the acceptable computation duration for high-speed applications. Each k-space patch can be reconstructed independently which enables simple parallelization of the algorithm that further reduces the reconstruction times. All these features allow for this type of ConvNet to be applied and trained on high-dimensional (≥256) and multi-dimensional (two, three, and higher dimensional) images.

In one aspect, the invention provides a method for magnetic resonance imaging (MRI) comprising: scanning a field of view using an MRI apparatus; acquiring sub-sampled multichannel k-space data U representative of MRI signals in the field of view; estimating an imaging model A and corresponding model adjoint $A_{adj}$ by estimating a sensitivity profile map; dividing sub-sampled multi-channel k-space data U into sub-sampled k-space patches; processing the sub-sampled k-space patches using a deep convolutional neural network (ConvNet) to produce corresponding fully-sampled k-space patches; assembling the fully-sampled k-space patches together with each other and with the sub-sampled multi-channel k-space data U to form a fully-sampled k-space data V, and transforming the fully-sampled k-space data V to image space using the model adjoint $A_{adj}$ operation to produce an image domain MRI image.

The processing of the sub-sampled k-space patches to produce corresponding fully-sampled k-space patches preferably involves processing each k-space patch $u_i$ of the sub-sampled k-space patches separately and independently from other patches to produce a corresponding fully-sampled k-space patch $v_i$, thereby allowing for parallel processing.

The processing of each k-space patch $u_i$ preferably includes applying the k-space patch $u_i$ as input to the ConvNet to infer a corresponding image space bandpass-filtered image $y_i$, wherein the ConvNet comprises repeated de-noising blocks and data-consistency blocks; and estimating the fully-sampled k-space patch $v_i$ from the image space bandpass-filtered image $y_i$ using the imaging model A and a mask matrix.

Each of the de-noising blocks preferably includes transforming k-space patch data to image space bandpass-filtered image data, and passing the image space bandpass-filtered image data through multiple 2D or 3D convolution layers to produce de-noised image space bandpass-filtered image data.

Each of the data-consistency blocks preferably includes passing the de-noised image space bandpass-filtered image data through the imaging model A to produce known k-space patch data. Applying the k-space patch $u_i$ as input to a ConvNet to infer an image space bandpass-filtered image $y_i$ preferably includes applying masks and a window function to k-space patch data, and passing k-space patch data through the adjoint model to produce image space bandpass-filtered image data.

Preferably, the sub-sampled multi-channel k-space data U, sub-sampled k-space patches, fully-sampled k-space patches, fully-sampled k-space data V, and image domain MRI image are two-dimensional data. Alternatively, they may be three-dimensional data.

In the imaging model A estimation, non-Cartesian sampling trajectories, motion information, and/or off-resonance de-phasing may be included in the imaging model.

The techniques of the present invention perform rapid and robust image reconstruction for magnetic resonance imaging scans that are prospectively subsampled. Subsampling reduces the acquisition time for each scan, reducing the total MRI exam duration. The techniques of the invention are especially useful for situations where the reconstruction is memory limited, as in the case of multi-dimensional imaging (three or more dimensions) that may include volumetric spatial dimensions, cardiac motion, respiratory motion, contrast-enhancement, velocity, diffusion, and echo dimensions. This invention can be applied for the scaling and enlargement of images for display in high-resolution displays and for prints. This invention enables the flexibility to use a single trained network for the enlargement of images to different sizes and spatiotemporal resolutions. Further, these techniques can be applied to other imaging applications where the measurement is performed in the image frequency domain.

BRIEF DESCRIPTION OF THE SEVERAL VIEWS OF THE DRAWINGS

FIG. 5 is a flowchart illustrating the steps of a method for MRI imaging, according to an embodiment of the invention.

DETAILED DESCRIPTION OF THE INVENTION

Figure 1:
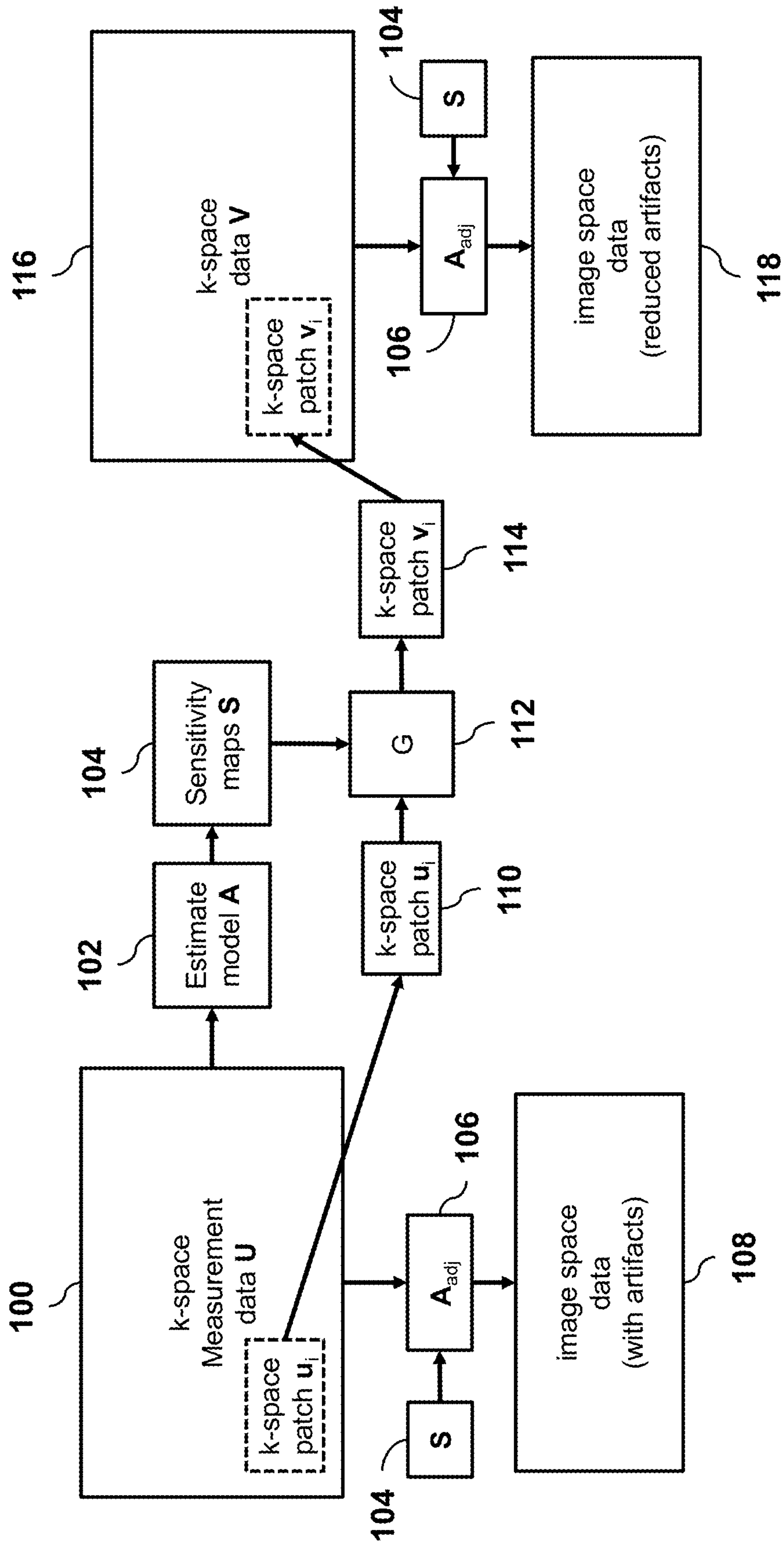
FIG. 1 is a schematic diagram illustrating an overview of a method for processing subsampled MRI data, according to an embodiment of the invention.

According to an embodiment of the invention, training and inference will all be performed on localized patches of k-space. FIG. 1 provides an overview of the method of processing subsampled multi-channel measurement data 100 in the k-space domain. The imaging model A is first estimated 102 by extracting the sensitivity maps 104 of the imaging sensors specific for the input data. This model can be directly applied with the model adjoint $A_{adj}$ operation 106 to yield a simple image reconstruction 108 with image artifacts from data subsampling. For the reconstruction, a k-space patch 110 of the input data is inserted into a convolution neural network G 112 which also uses the imaging model in the form of sensitivity maps. The output of G is a fully sampled k-space patch 114 for that k-space region. This patch is then inserted into the final k-space output 116. Two example patches are shown in blue and green with the corresponding images overlaid. By applying this network for all k-space patches, the full k-space data 116 is reconstructed. The final artifact-free image 118 is obtained by application of the model adjoint $A_{adj}$ operation 106 to the final k-space output 116.

Figure 2:
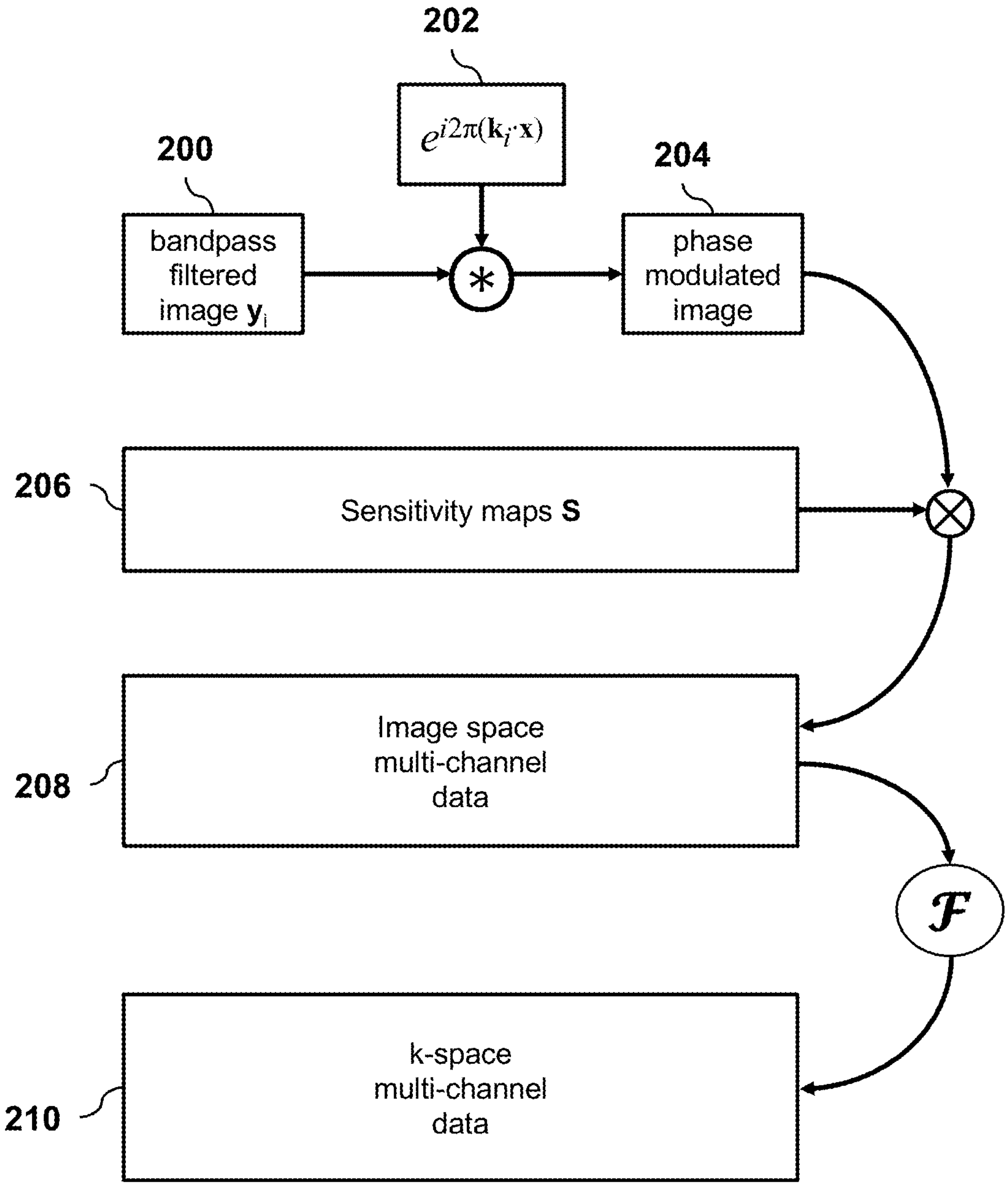
FIG. 2 is a schematic diagram illustrating an MRI imaging model, according to an embodiment of the invention.

The reconstruction relies upon the estimation and application of imaging acquisition model A. FIG. 2 provides an overview of the imaging model A. Bandpass-filtered image-space data $y_i$ 200 is passed through the imaging model for MRI where a windowing function centered at $k_i$ was applied in frequency space. First, a phase modulation $e^{i2\pi k_i \cdot x}$ 202 is applied to the bandpass-filtered image-space data $y_i$ 200 through a point-wise multiplication (*). The resulting image 204 is then multiplied by the sensitivity maps 206 to yield multichannel data 208. In this example, six channels are shown, and these channels were derived after a singular-value-decomposition-based compression. A Fourier transform operator $\mathcal{F}$ is then applied to transform the image-space data into the frequency domain (or k-space) data 210.

For each localized k-space patch, the goal of reconstruction is to solve the following inverse problem:

$$u_i = M_i A(e^{i2\eta k_i \cdot x} * y_i). \quad (1)$$

where $u_i$ is a selected k-space patch with its center pixel at k-space location $k_i$, $M_i$ is a mask matrix, and $y_i$ is image-space data that is bandpass-filtered at frequency $k_i$ corresponding to the k-space patch $u_i$. The imaging model A transforms the desired image-space data $y_i$ to the k-space (measurement) domain using sensitivity profile maps S and a Fourier transform $\mathcal{F}$. Sensitivity maps S are independent of the k-space patch location and can be estimated using conventional algorithms, such as ESPIRiT. Since S is set to have the same image dimensions as the k-space patch, S is faster to compute and have a smaller memory requirement in this bandpass formulation.

After the imaging model A transforms the data to the k-space domain, matrix $M_i$ is applied to mask out the missing points (due to subsampling) from the k-space patch $u_i$. When selecting the k-space patch $u_i$ with its center pixel at k-space location $k_i$, a phase is induced. To remove the impact of this phase when solving the inverse problem, the phase is modeled separately as $e^{i2\eta k \cdot x}$ where x is the corresponding spatial location of each pixel in $y_i$. This phase is applied through an element-wise multiplication, denoted as *.

The inverse problem of Eq. 1 can be solved to estimate the image space bandpass-filtered image data $\hat{y}_i$ using any standard algorithm for inverse problems with a least squares formulation with a regularization function R $(y_i)$ and regularization parameter $\lambda$ to help constrain the problem:

$$\hat{y}_i = \underset{yi}{\operatorname{argmin}} \| W[M_i A(e^{i2\pi k_i \cdot x} * y_i) - u_i] \|_2^2 + \lambda R(y_i). \tag{2}$$

In Eq. 2, we introduce a windowing function W to avoid Gibbs ringing artifacts. The model A includes sensitivity maps S that can be considered as a element-wise multiplication in the image domain or a convolution in the k-space domain. This window function also accounts for the wrapping effect of the k-space convolution when applying S in the image domain. Alternatively, the imaging acquisition model A can be applied in the k-space domain as convolutions. These k-space approaches include GRAPPA and SPIRiT. However, these approaches reconstruct $y_i$ as a multi-channel image and increases the number of channels for the regularization function R(.). In the corresponding deep neural network formulation of these approaches, the increase in number of channels will also increase the number of channels as the initial input to the neural network.

Though Eqs. 1 and 2 are set up to solve for $y_i$ which is a bandpass-filtered version of the final image, the final goal is to estimate the missing data points $v_i$ that were not originally measured. After estimating for $y_i$, the missing points can be estimated using the modified forward imaging model as $$v_i = M_i^c A(e^{i2\eta k \cdot x} * y_i) \tag{3}$$

where $M_i^c$ masks out the measured points and leaves the points that were not originally measured.

Incorporating a strong prior in the form of a regularization function has been demonstrated to enable high image quality despite high subsampling factors. In compressed sensing, the sparsity of the image in a sparsifying transform domain, such as spatial Wavelets or finite differences, can be exploited to enable undersampling factors of over 8 times Nyquist rates. Even though the problem formulation is similar to applying Wavelet transforms, directly enforcing sparsity in that domain may not be the optimal solution and the regularization parameter for each k-space location must be tuned.

To avoid the problems above with existing approaches, instead of solving Eq. 1 using a standard algorithm, the techniques of the present invention apply developments in deep convolutional neural networks (ConvNets). A key insight is that the ConvNets can be trained to rapidly solve the many small inverse problems in a feed-forward fashion. Based on the input k-space patch, the ConvNet is sufficiently flexible to adapt to solve the corresponding inverse problem, as outlined above with reference to FIG. 1. The ConvNet can be considered to learn a better de-noising operation for each specific bandpass-filtered image for a stronger image prior. After the different frequency bands are reconstructed, the different k-space patches 114 are gathered to form the final image 116. The technique allows for flexibility in choosing the patch sizes and the amount of overlap between each patch.

In our experiments, we used 64×64 overlapping k-space patches. To avoid artifacts from the windowing function and from edge effects, the center 44×44 of the output is inserted into the final k-space image 116. In the areas of overlap, outputs are averaged for the final solution.

The reconstruction pipeline is summarized in Algorithm 1.

A method for magnetic resonance imaging (MRI) using this reconstruction technique is shown in the flowchart of FIG. 5. In step 500 a field of view is scanned using an MRI apparatus. Sub-sampled multi-channel k-space data U representative of MRI signals in the field of view is acquired in step 502. In step 504 an imaging model A is estimated by estimating a sensitivity profile map. The corresponding model adjoint $A_{adj}$ obtained from A. In step 506 the sub-sampled multi-channel k-space data U is divided into sub-sampled k-space patches. Step 508 performs the processing of the sub-sampled k-space patches using a deep convolutional neural network (ConvNet) to produce corresponding fully-sampled k-space patches. The fully-sampled k-space patches are assembled together to form a fully-sampled k-space data V in step 510, and in step 512 the fully-sampled k-space data V is transformed to image space using the model adjoint $A_{adj}$ operation to produce an image domain MRI image.

Algorithm 1 Reconstruction pipeline

Input: Set of k-space patches $u_i$ of full k-space image U with corresponding k-space location $k_i$ for the center pixel of each patch. U is subsampled (has missing points).
Output: Reconstructed k-space image V Estimate model A
V ← U {Initialize V with known measurements}
for all $u_i$ at $k_i$ do
    $y_i \leftarrow G(u_i, k_i, A)$ {Inference using ConvNet G(.)}
    $v_i \leftarrow M_i^c A\,(e^{i2\pi k \cdot x} * y_i)$ {Estimate missing data points}
    Insert $v_i$ into V
end for The processing of the sub-sampled k-space patches in 508 processes each k-space patch $u_i$ of the sub-sampled k-space patches separately and independently from other patches to produce a corresponding fully-sampled k-space patch $v_i$, thereby allowing for parallel processing. Each k-space patch $u_i$ is applied as input to the ConvNet to infer an image space bandpass-filtered image $y_i$. The fully-sampled k-space patch $v_i$ is estimated from the image space bandpass-filtered image $y_i$ using the imaging model A and a mask matrix.

According to embodiments of the present invention, the inverse problem of Eq. 2 is solved with a convolutional neural network (ConvNet), denoted as G(.) in Algorithm 1 and FIG. 1. Any ConvNet architecture can be used for this purpose, but to demonstrate the ability to incorporate the imaging model in an easy to understand fashion, the architecture illustrated here is based on the unrolled optimization with deep priors. For simplicity, the architecture used to demonstrate solving the inverse problem is based on projection onto convex sets (POCS). In this framework, two different blocks are repeated: 1) de-noising block and 2) data-consistency block.

The de-noising block is composed of 2D convolution layers. The real and imaginary components of the complex data are treated as two separate channels. The input is a bandpass-filtered image of dimensions N×N×2. The input is passed through an initial convolution layer with 3×3 kernels that expands the data to 128 feature maps. The data is then passed through 5 layers of repeated 3×3 convolution layers with the same number of 128 feature maps. A final 3×3 convolution layer combines the 128 feature maps back to the 2 feature maps of real and imaginary components. Additionally, the initial input is added back to the output of the convolution layers. After each of the convolution layer except the last one, the data is passed through a batch normalization layer (BN) and a Rectified Linear Unit layer (ReLU). No normalization or activation layer is applied at the last layer to ensure that the sign (positive or negative) of the data is perserved. The input data for k-space patch $u_i$ to the k-th de-noising block $R_k$ is denoted as $y_i^k$. The output of the de-noising block is denoted as $y_i^{k+}$:

$$y_i^{k+}=R_k(y_i^k). \tag{4}$$

The data-consistency block enforces consistency with the measured data points. This block is important to ensure that the final reconstructed image agrees with the measured data points to minimize the chance of hallucination. More specifically, the data $y_i^{k+}$ after the k-th de-noising block is passed through the forward model to transform the data into the measurement (k-space) domain:

$$u_i^k=A(e^{i2\pi k_i\cdot x}*y_i^{k+}). \tag{5}$$

The known measured points $u_i$ are inserted into the correct k-space locations, and then multiplied by the window function W:

$$u_i^{k+1}=W(M_i^c u_i^k+M_i u_i). \tag{6}$$

The data is then passed through the adjoint model to transform the data back to the image domain:

$$y_i^{k+1}=e^{-i2\pi k_i\cdot x}A_{adj}u_i^{k+1} \tag{7}$$

Here, $A_{adj}$ denotes the adjoint to A.

The two blocks, de-noising and data-consistency, are repeated. The weights in the convolution layers in the de-noising block can be kept constant for each repeated block or varied.

In our experiments, we repeat the two blocks for 8 iterations and allow the weights to vary for each block to allow for more flexibility in the network.

We now turn to discussing issues of computational implementation.

To solve the inverse problem of Eq. 1, iterative algorithms are typically used. During each iteration, element-wise multiplication and addition are performed. Additionally, the inverse and forward multi-dimensional Fourier transform is performed. Despite advanced algorithmic developments, this Fourier transform is still the most computationally expensive operation. For the conventional approach of reconstructing the entire 2D image at once, each 2D Fourier transform requires O $(N_zN_y \log(N_yN_z))$ operations for an image of dimensions $N_y \times N_z$.

According to the techniques of the present invention, the inverse problem is only applied for localized patches of k-space; thus, all operations including the Fourier transform are performed with smaller image dimensions. Thus, this patch-based approach significantly reduces the amount of computation. For example, given an initial image dimensions of $N_y=256$ and $N_z=256$, we aim to perform the reconstruction as solving the inverse problem for patches of dimensions 64×64. In such a formulation, we effectively reduce the computation for the Fourier transform by over 21 fold.

In embodiments of the present invention, we can further accelerate the reconstruction procedure in two ways. First, the reconstruction of each individual k-space patch can be performed independently. This property enables the ability to parallelize the reconstruction process. Therefore, the entire reconstruction can be performed in the time in takes to reconstruct a single patch which further leverages the benefit of applying the Fourier transform operator on smaller image dimensions. Second, conventional iterative approaches to solve Eq. 1 requires an unknown number of iterations for convergence and the need to empirically tune the regularization parameter for each type of scan. In the deep learning approach of the present invention, on the other hand, the number of iterations is fixed, and the network is trained to converge to an adequate solution in the given number of iterations. Further, the need to empirically tune the regularization parameter and step sizes are eliminated as these parameters are effectively learned through the given training examples.

For purposes of illustration, we now provide examples of training and reconstruction using real data.

Volumetric abdominal images were acquired using gadolinium-contrast-enhanced MRI with a 3T scanner (GE 750 Scanner) and a 32-channel cardiac coil array. Free-breathing T1-weighted scans were collected from 301 pediatric patients using a 1-2 minute RF-spoiled gradient-recalled-echo sequence with pseudo-random Cartesian view-ordering and intrinsic navigation. For the Cartesian sampling trajectory, data were fully sampled in the $k_m$ direction (spatial frequency in x) and were subsampled in the $k_y$ and $k_z$ directions (spatial frequency in y and z). The raw imaging data was first compressed from the 32 channels to 6 virtual channels using a singular-value-decomposition-based compression scheme. The datasets were modestly subsampled with a reduction factor of 1 to 2, and the datasets were first reconstructed using parallel imaging with ESPIRiT and compressed sensing with spatial wavelets. Using the motion measured with the intrinsic navigation, respiratory motion was suppressed by weighting each data point according to the degree of motion corruption. This initial reconstruction was performed using the Berkeley Advanced Reconstruction Toolbox (BART).

For training, all volumetric data were first transformed into the hybrid (x, $k_y$, $k_z$)-space. Each separate x-slice was considered as a separate data sample. The dataset was divided by patient: 229 patients for training (44006 slices), 14 patients for validation (2688 slices), and 58 patients for testing (11135 slices). Thirty six different sampling masks were generated using variable density poisson disc sampling with reduction factors ranging from 2 to 9 with a fully sampled calibration region of 10×10 in the center of the frequency space. During training, data was augmented by applying a randomly selected sampling mask and randomly flipping the data in y and in z. Sensitivity maps for the data acquisition model were estimated using ESPIRiT. For training, the Adam optimizer was used with $\beta_1=0.9$, $\beta_2=0.999$ and a learning rate of 0.001.

Figure 3:
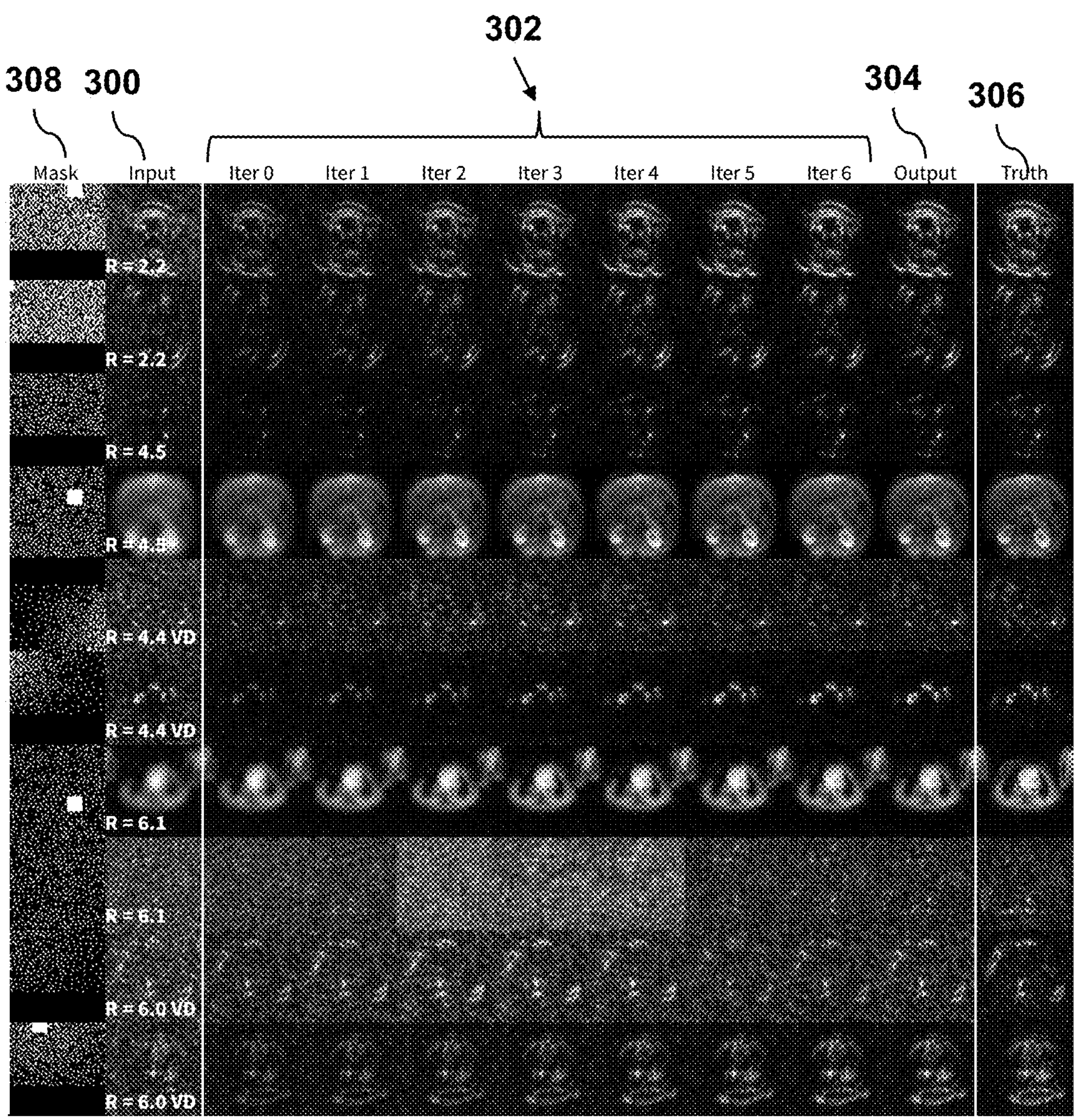
FIG. 3 shows a grid of MRI imaging data in various steps of processing, for with different subsampling factors (R), according to an embodiment of the invention.

The image grid of FIG. 3 shows example outputs from the ConvNet for a random selection of data samples and frequency bands. Pseudo-random sampling masks (column 308) were generated for each input data sample (column 300) with different subsampling factors (R). If variable-density subsampling was used, the reported subsampling factor is annotated with "VD." Column 300 corresponds to the input to the network. The seven columns 302 ("Iter 0" to "Iter 6") correspond to the image at subsequent stages of an 8-stage ConvNet. The final stage is shown in column 304 as the network output. The ground truth is displayed in the final column 306. Generally, the network output 304 is comparable to the ground truth 306. For higher subsampling factors (R>5), residual artifacts remain. Further, if the data has a higher noise level, residual noise remains.

Figure 4:
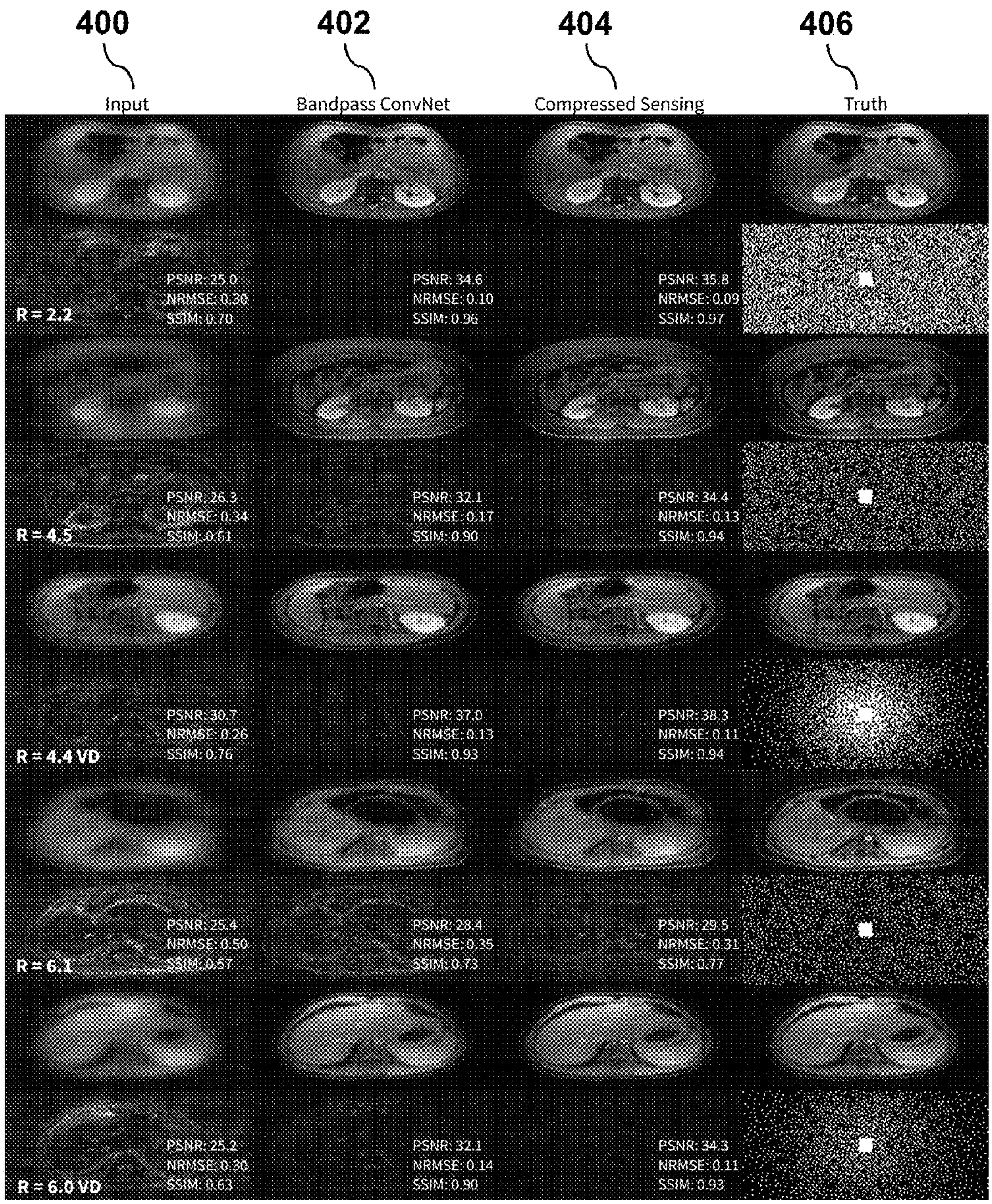
FIG. 4 shows a grid of MRI imaging data for different subsampling factors (R), contrasting output images of conventional compressed sensing reconstructions with output images according to an embodiment of the invention.

The final results of reconstruction using techniques of the present invention are compared with state-of-the-art compressed sensing with parallel imaging in the image grid of FIG. 4. Example results were randomly selected from a test set for different subsampling factors R. These examples are selected from the examples shown in FIG. 3. The original images in column 406 are subsampled with the sampling mask shown and the subsampling factor (R). The inpute subsampled image is shown in the first column 400. The output of the bandpass ConvNet technique of the present invention is shown in column 402 and the output of state-of-the-art compressed sensing reconstructions are displayed in column 404. Peak to signal noise ratio (PSNR), normalized root mean square error (NRMSE) normalized by the image norm, and structural similarity index (SSIM) are annotated below each image over the different image (×2). The bandpass ConvNet technique of the present invention yielded comparable image quality to the state-of-the-art compressed sensing reconstruction but with a significant reduction in computation and memory footprint.

The embodiments describe above are intended as concrete examples to illustrate the general principles of the invention as applied to specific implementations. Those skilled in the art will readily appreciate based on the teachings of the present application that many alternatives and variations of embodiments are possible.

The techniques of the present invention may be implemented on any standard MRI apparatus, suitable modified to reconstruct images in accordance with the techniques described here.

Different loss functions can be used for training to improve image accuracy and sharpness. These loss functions include structural similarity index metric (SSIM), $l_2$ norm, l2 norm, and combinations of the different functions. Furthermore, the network can be trained using an adversarial network in a generative adversarial network structure.

Embodiments of the invention allows for flexibility in using different neural network structures that are used to reconstruct each frequency band. These neural network structure can include residual networks (ResNets), U-Nets, autoencoder, recurrent neural networks, and fully connected networks.

Embodiments of the invention can be modified to apply different and/or independent networks for each frequency band. For instance, one network can be trained and applied for frequency bands at lower spatial frequencies, and a different network can be trained and applied for frequency bands at higher spatial frequencies.

Additional information (such as the patch location, subsampling factor, anatomy) can be incorporated as additional inputs to the convolutional neural network.

Embodiments of the invention also allows for flexibility in modifying the imaging model used. The imaging model may include off-resonance information, signal decay model, k-space symmetry with homodyne filtering, and arbitrary sampling trajectories (radial, spiral, hybrid encoding, etc.).

Embodiments of the invention can be extended to multi-dimensional space that may include volumetric space, cardiac-motion dimension, respiratory-motion dimension, contrast-enhancement dimension, time dimension, diffusion direction, velocity, and echo dimension.

Embodiments of the invention can be used in conjunction with conventional image reconstruction methods. The results of the network can be used to initialize iterative reconstruction techniques. The results of the network can be applied for specific areas of the measurement domain: such as the center of k-space for improved data calibration for methods like parallel imaging.

Embodiments of the invention can be used to parallelize detection and correction of corrupt measurement values on a patch-by-patch basis.

The results from embodiments of the invention can also be passed through another deep neural network to further improve reconstruction accuracy.

The invention claimed is:

1. A method for magnetic resonance imaging (MRI) comprising:

(a) scanning a field of view using an MRI apparatus;

(b) acquiring sub-sampled multi-channel k-space data U representative of MRI signals in the field of view;

(c) estimating an imaging model A and corresponding model adjoint $A_{adj}$ by estimating a sensitivity profile map;

(d) dividing sub-sampled multi-channel k-space data U into sub-sampled k-space patches;

(e) processing the sub-sampled k-space patches using a deep convolutional neural network (ConvNet) to produce corresponding fully-sampled k-space patches;

(f) assembling the fully-sampled k-space patches together with each other and with the sub-sampled multi-channel k-space data U to form a fully-sampled k-space data V, (g) transforming the fully-sampled k-space data V to image space using the model adjoint $A_{adj}$ operation to produce an image domain MRI image.

2. The method of claim 1 wherein processing the sub-sampled k-space patches using a deep convolutional neural network (ConvNet) to produce corresponding fully-sampled k-space patches comprises:

processing each k-space patch $u_i$ of the sub-sampled k-space patches separately and independently from other patches to produce a corresponding fully-sampled k-space patch $v_i$, thereby allowing for parallel processing.

3. The method of claim 2 wherein processing each k-space patch $u_i$ to produce a corresponding fully-sampled k-space patch $v_i$ comprises:

applying the k-space patch $u_i$ as input to the ConvNet to infer an image space bandpass-filtered image $y_i$, wherein the ConvNet comprises repeated de-noising blocks and data-consistency blocks;

estimating the fully-sampled k-space patch $v_i$ from the image space bandpass-filtered image $y_i$ using the imaging model A and a mask matrix.

4. The method of claim 3 wherein each of the de-noising blocks comprises transforming k-space patch data to image space bandpass-filtered image data and passing the image space bandpass-filtered image data through multiple convolution layers to produce de-noised image space bandpass-filtered image data;

wherein each of the data-consistency blocks comprises passing the de-noised image space bandpass-filtered image data through the imaging model A to produce known k-space patch data;

wherein applying the k-space patch $u_i$ as input to a ConvNet to infer an image space bandpass-filtered image $y_i$ further comprises applying masks and a window function to k-space patch data, and passing k-space patch data through the adjoint model to produce image space bandpass-filtered image data.

5. The method of claim 4
wherein the multiple convolution layers are two-dimensional convolution layers, or three-dimensional convolution layers.

6. The method of claim 1
wherein the sub-sampled multi-channel k-space data U, sub-sampled k-space patches, fully-sampled k-space patches, fully-sampled k-space data V, and image domain MRI image are all two-dimensional data or are all three-dimensional data.

7. The method of claim 1
wherein estimating an imaging model A comprises including motion information and off-resonance de-phasing in the imaging model.

8. The method of claim 1
wherein estimating an imaging model A comprises including non-Cartesian sampling trajectories in the imaging model.

* * * * *